United States Patent [19]

Albee

[11] Patent Number: 4,862,069

[45] Date of Patent: Aug. 29, 1989

[54] METHOD OF IN-CIRCUIT TESTING

[75] Inventor: Alan J. Albee, Nashua, N.H.

[73] Assignee: GenRad, Inc., Concord, Mass.

[21] Appl. No.: 82,054

[22] Filed: Aug. 5, 1987

[51] Int. Cl.$^4$ .............................................. G01R 31/02
[52] U.S. Cl. .............................. 324/73 R; 324/73 AT;
324/522; 324/537
[58] Field of Search ................ 324/73 R, 73 AT, 522,
324/523, 537; 371/25, 20, 28; 364/568, 569

[56] References Cited

U.S. PATENT DOCUMENTS

| | | | |
|---|---|---|---|
| 3,820,077 | 6/1974 | Giebler et al. | 371/28 |
| 4,104,581 | 8/1978 | Arkosy | 324/523 |
| 4,255,748 | 3/1981 | Bartlett | 371/28 |
| 4,392,107 | 7/1983 | Gollomp | 371/25 |
| 4,418,403 | 11/1983 | O'Joole et al. | 371/28 |
| 4,435,805 | 3/1984 | Hsieh et al. | 371/15 |
| 4,459,693 | 7/1984 | Prang et al. | 324/73 R |
| 4,514,845 | 4/1985 | Starr | 371/15 |
| 4,647,846 | 3/1987 | Malkin | 371/25 |
| 4,670,708 | 6/1987 | Bosnyak et al. | 371/25 |
| 4,719,459 | 1/1988 | Kovacs et al. | 324/73 R |

Primary Examiner—Reinhard J. Eisenzopf
Assistant Examiner—W. Burns
Attorney, Agent, or Firm—Nutter, McClennen & Fish

[57] ABSTRACT

A circuit tester (12) tests an electronic circuit (10) to determine which of a number of bus devices (16, 18, and 20) on the circuit (10) is stuck in an asserting state and is thus keeping a bus (14) at the asserted voltage level. A back-driving source (21) back-drives the bus (14) to its de-asserted level, and each of the devices (16, 18, and 20) is enabled individually in succession. When a device is enabled, a current meter (22) determines whether the bus current increases as a result. If so, the given device is not the defective device that is keeping the bus asserted. If there is no current change, the device is the defective one. A current limit is imposed on the back-driving source (16). This limit depends on the particular device being enabled; the limit is set higher than the quiescent assertion current on the bus but less than the sum of the quiescent current and the assertion-current capacity of the device being enabled. Reduced current and voltage on the bus, and thus reduced power dissipation during the enablement of a device, thereby result.

5 Claims, 2 Drawing Sheets

METHOD OF IN-CIRCUIT TESTING

BACKGROUND OF THE INVENTION

The present invention is directed to in-circuit testing. It has particular, although no exclusive, applicability to the identification of defective devices on a common bus.

In-circuit testing is the testing of electronic devices after they have already been connected together in a circuit. To test a given device in an in-circuit test, it may be necessary to "back-drive" nodes driven by other devices in the circuit. Back-driving is forcing a node to the level opposite that to which a device is attempting to drive it. Back-driving requires employing considerably more current than is ordinarily needed to generate signals in the circuit, and it results in dissipation of considerable power in the devices whose outputs are being overcome by the backdriving. The power levels are such that, if sustained indefinitely, they would damage the device in question. In circuit tests are therefore designed so that the backdriving duration is kept below a dangerous level. Thus, back-driving imposes a constraint on the in-circuit test.

SUMMARY OF THE INVENTION

The present invention reduces this constraint on in-circuit testing by imposing on the back-driving source a variable current limit that is high enough to permit backdriving of the involved circuit elements but is low enough to reduce power dissipation significantly. The method of the present invention is particularly advantageous in tests used to detect a defective circuit device that has an output port on a common bus.

In an existing method of determining which of a plurality of devices connected to a common bus is causing the common bus to be stuck in an asserted state, the bus is back-driven to bring its voltage to a de-asserted level. Each device on the bus is then individually enabled to the state in which it would ordinarily drive the bus to its asserted level. If the device is working properly, the test causes more current to flow through the bus when the device is in the asserting state than when it is not, so a change in bus current indicates a properly operating device. When enablement of a given device does not cause a change in current, the test apparatus concludes that the given device is the one that is stuck in the enabled state. In this manner, the defective device is identified.

The present invention improves this method by varying the current limit on the back-driving source in accordance with the quiescent current flowing in the "stuck" bus. Specifically, the current limit on the back-driving source is set to some value greater than the quiescent value but less than the sum of the quiescent current and the current that a properly operating device of the enabled type will draw if its output node is being overdriven. Accordingly, when a device is enabled, it dissipates less power than it would if the source operated with a fixed current limit. Furthermore, the test can be performed by making a voltage measurement—often simply a digital voltage measurement-rather than making a current measurement.

BRIEF DESCRIPTION OF THE DRAWINGS

These and further features and advantages of the present invention are described in connection with the accompanying drawings, in which.

DETAILED DESCRIPTION OF AN ILLUSTRATIVE EMBODIMENT

Figure 1:
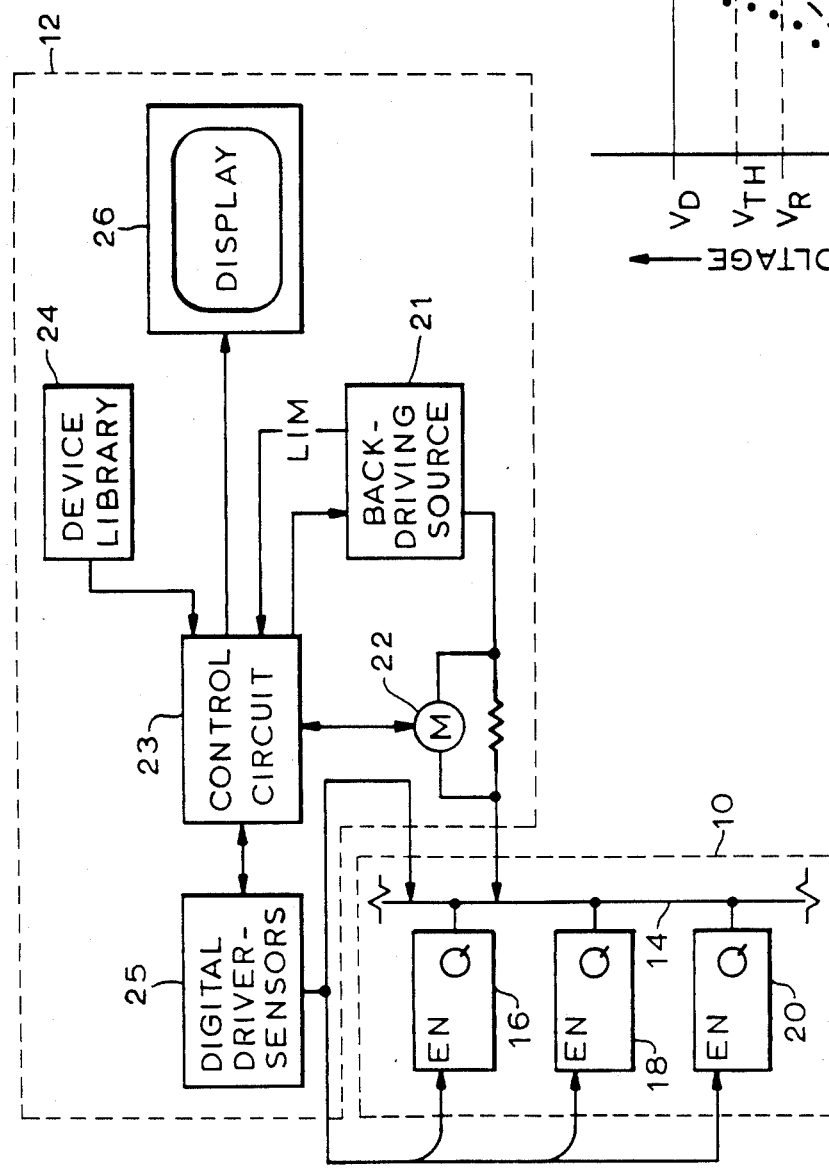
FIG. 1 is a block diagram of a circuit under test and selected elements of an automatic circuit tester for testing it.

FIG. 1 depicts a circuit 10 being tested by an automatic circuit tester 12. The circuit 10 includes, among other elements, a common bus line 14, which is a common output node of several circuit devices 16, 18, and 20. The test to which the illustrated embodiment of the present invention is directed is one for identifying which of the three devices 16, 18, and 20 is defective.

Ordinarily, a device is tested by applying a sequence of signals to its input terminals and observing the signals that result at its output terminals. This process is complicated in a bus-oriented circuit, however, because it is the distinguishing feature of a bus organization that several devices have an output node in common. Even though a given device may not be driving its output node to the asserted level, therefore, that node may be at the asserted level anyway because one of the other devices is driving it to that level. Of course, one would normally place the other devices sharing the common node into a state in which they should not assert the common node, but one of the other devices may be defective; it may be stuck at the state in which it drives the common node (i.e., the bus) to its asserted state. Accordingly, a proper circuit test cannot be performed simply by observing the voltage levels at device output nodes.

To pave the way for an effective device test, therefore, U.S. Pat. No. 4,459,693 to Prang et al. disclosed an advantageous testing procedure for determining which, if any, of the bus devices is keeping the bus stuck in an asserted state. Once the "stuck" state of the bus is remedied, testing of the bus devices can proceed. According to the Prang et al. method, the tester 12 of FIG. 1 applies to each of the devices 16, 18, and 20 signals that will cause them to refrain from asserting the common bus if they are operating properly. If the result of applying these signals is a de-asserted voltage level on bus 14, then the normal in-circuit tests of devices 16, 18, and 20 proceed. On the other hand, if the voltage on bus 14 remains at its asserted level, further steps must be taken to identify the device that is stuck in the asserted state.

Specifically, a back-driving source 21 drives the bus 14 with enough current to bring it to its de-asserted level even if one or more of the bus devices is attempting to drive the bus 14 to the asserted level. Each of the bus devices 16, 18, and 20 is individually placed into its asserting state and then returned to its de-asserting state, and a meter 22 measures the current that flows from the source 21 to the bus 14. If, when a device 16, 18, or 20 is placed into its asserting state, the current supplied by the back-driving source 21 increases, then that device was, as expected, previously in the de-asserting state; that is, it is not the defective device. On the other hand, when the automatic tester 12 applies enabling signals to a device and no increase in current occurs, that device is identified as the defective device.

The present invention is an improvement on the Prang et al. method. As was just indicated, the Prang et al. method employs back-driving, which results in high power dissipation and must therefore be short in duration. The present invention employs back-driving, too, but the current applied by the back-driving source 16 is significantly reduced, so the duration constraint is not as stringent. Furthermore, the back-driving time can be reduced. significantly because a digital measurement can replace the analog one, which is typically of much greater duration than a digital measurement. These results are achieved by imposing on the back-driving source a current limit that varies in accordance with bus quiescent current, i.e., in accordance with the current that flows in bus 14 when all devices 16, 18, and 20 are ostensibly in their de-asserting states.

Figure 2:
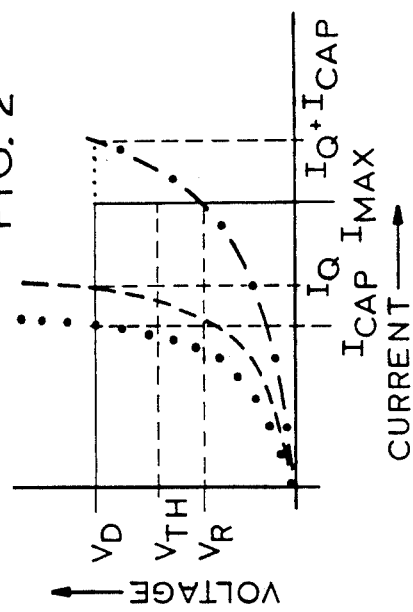
FIG. 2 is a voltage-versus-current plot illustrating the operation of the back-driving source employed by the automatic circuit tester of FIG. 1.

Specifically, the back-driving source 21 is set to apply to the bus 14 a de-assertion voltage $V_D$ shown in FIG. 2 and to keep the bus at that voltage level unless the current drawn by the bus reaches $I_{MAX}$. When the current reaches $I_{MAX}$, the voltage falls off, as FIG. 2 indicates. Most voltage sources employed in existing circuit testers employ current limits, too, but the back-driving source 21 employed in accordance with the present invention is programmable, and the control circuitry 23 of the circuit tester 12 programs this current limit in accordance with the quiescent current.

For example, suppose that the bus 14 of circuit 10 is found to be stuck at the assertion level. According to the present invention, the back-driving source 21 back-drives the bus 14 to its de-asserted level and uses meter 22 to determine what the resultant quiescent current in the bus is with all of the bus devices 16, 18, and 20 in the states in which they do not assert signals on the bus if they are working properly. We will assume that the quiescent current is the level $I_Q$ of FIG. 2. The control circuit 23 then adds to the quiescent current a current increment to arrive at the current limit $I_{MAX}$.

The current increment may simply be a fixed value large enough to provide a measure of noise rejection but small enough to be lower than the assertion-current capacity of any device that would drive the bus 14, i.e., lower than the current that would flow in the output port of any such device when it is back-driven to the de-assertion level. In the illustrated embodiment, however, the control circuit 23 consults a device library 24, which contains a different increment value for each of the devices 16, 18, and 20 to be tested. The control circuit 23 finds the increment value for device 16, which value may be, for example, thirty per cent of the assertion-current capacity $I_{CAP}$ of device 16, and computes the sum of the quiescent current and the increment value. This results in a current limit $I_{MAX}$ that is greater than $I_Q$ but less than $I_Q+I_{CAP}$. By making the increment value depend on the assertion-current capacity of the specific enabled device, one can maximize the current increment, and thus the noise immunity, while retaining the benefits of the invention.

The control circuit then operates one or more of the drivers in a group of digital driver-sensors 25 so as to place device 16 in the state in which it would ordinarily drive the bus 14 to its asserted level. If device 16 is the cause of the problem, it will already have been asserted, so there will be no increase in current as measured by meter 22. If device 16 is operating properly, on the other hand, more current will flow into bus 14 from the back-driving source 16, and the meter 22 can be used to indicate this fact to the control circuit 23.

Without the present invention, the back-driving source 21 would supply all the current that would be required to back-drive the bus 14 to its de-asserted level without regard to which devices are enabled. Thus, the back-driving source 21 would keep bus 14 drawing a high current $I_Q+I_{CAP}$ and cause a high level of power dissipation. It would thus be important for the measurement performed by meter 22 to proceed quickly so as to avoid damage to the circuit 10 under test and its constituent devices. According to the present invention, however, the current limit of the back-driving source 21 is adjusted in accordance with the quiescent current in the "stuck" bus. The result, as can be seen in FIG. 2, is that only current $I_{MAX}$ is drawn, and this current flows across a potential difference of only $V_R$. Consequently, the power dissipation is greatly reduced, and the time that can be permitted for measurement is increased.

After a determination has been made of whether device 16 is the defective device, control circuit 23 consults device library 24 again, this time to determine the increment current for device 18. It adds this new current capacity to the quiescent current and derives a new $I_{MAX}$. It then repeats the enablement and voltage-measurement operations. The same procedure is performed on device 20. For one of the devices, enablement will not result in an increase in bus current, and that device will be identified as the defective one.

As was just observed, this arrangement reduces the power dissipation and thus leaves a greater time interval for the current measurement, which can be performed by the (typically slow) analog meter 22. By a judicious choice of $I_{MAX}$, however, the measurement time can itself be greatly reduced. Since the current limit of the present invention results in a voltage drop when the enabled device operates properly, one of the digital sensors of the set 25 of digital driver-sensors can replace the analog meter 22. As FIG. 2 indicates, the voltage that results when a properly operating device is enabled can be made to be less than a threshold voltage $V_{TH}$ for which a digital sensor tests. Since a digital sensor operates much more quickly than an analog sensor, the duration of power dissipation can be reduced significantly.

In another alternative, the tester 12 can take advantage of a signal that the programmable-current-limit source 21 may provide. Such a source may generate a signal LIM that indicates whether the output current of the back-driving source 21 has exceeded the current limit $I_{MAX}$. A properly operating bus device will cause LIM to indicate that $I_{MAX}$ has been reached, but the "stuck" device will not.

When the test is completed, the control circuit provides an indication of the results by, for example, placing an appropriate display on a display device 26

Figure 3:
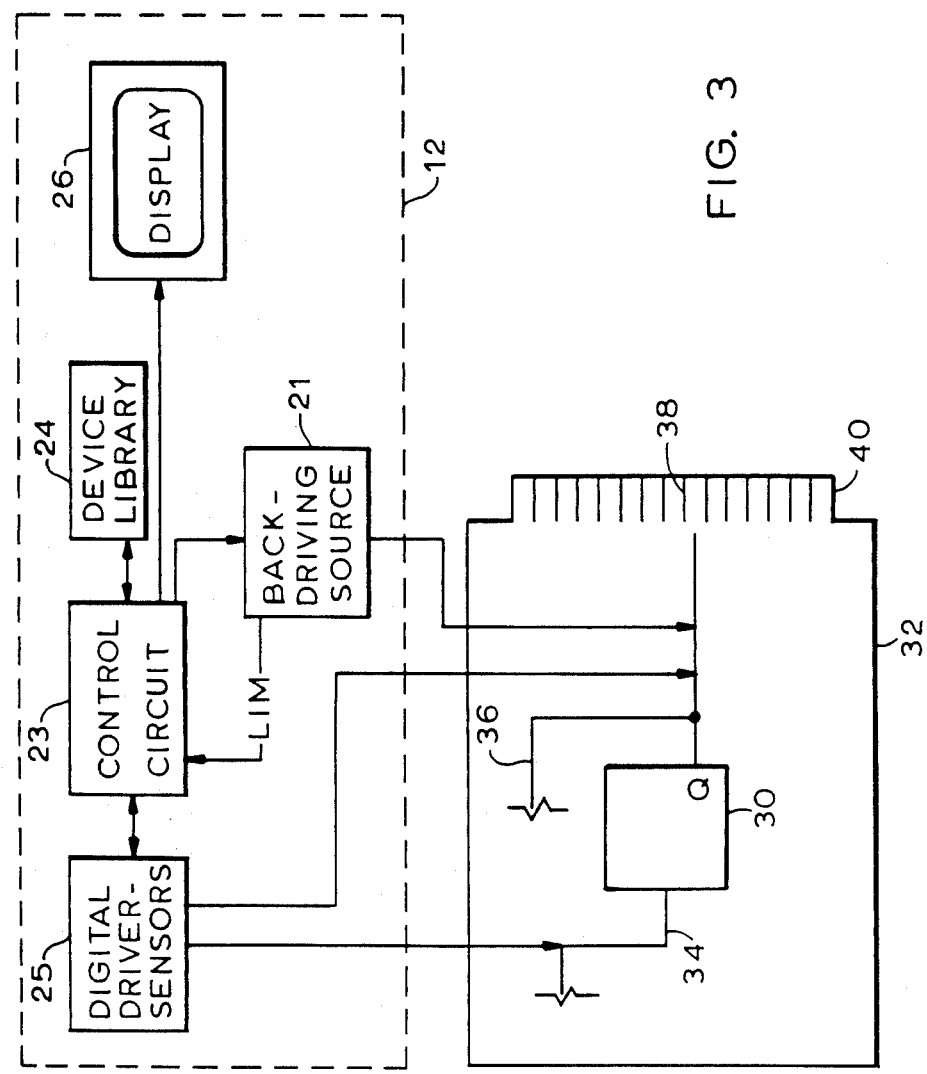
FIG. 3 is a block diagram that depicts another use of the present invention.

Although the advantages of the present invention are particularly evident in the type of test just described, the present invention can also be used in non-bus-type in-circuit-testing procedures. FIG. 3 illustrates the application of the present invention to non-bus-type testing situations. In FIG. 3, a device 30 to be tested is connected in circuit on a board 32. Device 30 receives input signals on at least one input line 34, which is driven by one of the digital driver-sensors 25 in the tester 12. Device 30 also drives an output line 36, which is connected to a load not shown. The output port of the device 30 is also connected to one of the terminals 38 of an edge connector 40. In accordance with the present invention, device 30 is tested to determine not only that its output is proper on the isolated board but also that its output will be correct if the device is subjected to a load such as might be connected to edge-connector terminal 38.

One way of making this determination would simply be to connect the additional load to terminal 38. However, a special connection or a fixturing modification would typically be needed in a conventional tester fixture to provide the load. The present invention eliminates the need for such an additional load. The programmable back-driving source 21 is connected to the output port of device 30 and set to the de-assertion voltage. The purpose of the back-driving source 21 in this case, however, is not to cause the output node to assume the de-assertion voltage. Instead, the current limit is set just below the rated output-current capacity of device 30 so as to determine whether device 30 can draw or drive the rated current.

If device 30 still is able to set its output node to the correct level even while the back-driving source is connected, then the automatic tester 12 determines that device 30 can meet the load requirements for which it is succeeds in changing the voltage to a different level, then device 30 has failed even if it is able to drive its output node to the correct voltage when the back-driving source 21 is not connected.

If the LIM signal is available, the device 30 passes or fails its output-current-capacity test in accordance with whether LIM indicates that the current limit has been met or not.

From the foregoing description, it is apparent that the present invention reduces power dissipation in devices under test, adds flexibility to automatic testing procedures, and has a wide range of applications. It thus constitutes a significant advance in the art.

I claim:

1. For performing a test on an electronic circuit comprising a common bus and a plurality of bus devices that are operable by application of enabling and disabling signals thereto to assume, when they are operating properly, enabled and disabled states, respectively, such that they drive the bus voltage to an assertion voltage value when at least one of the bus devices is in its asserted state, and such that the bus voltage assumes a de-assertion voltage value when all of the bus devices are in their disabled states, the purpose of the test being to determine which of the bus devices is driving the bus to an assertion voltage level even though all of the bus devices have had disabling signals applied thereto, a test apparatus comprising:
   A. driver means operable by application of control signals thereto selectively to apply enabling and disabling signals to the bus devices;
   B. a programmable back-driving source adapted for application thereto of programming signals representing a current limit, for driving the bus to the de-assertion voltage if the resultant current flow in the bus is less than the current limit represented by the programming signals but limiting its output current to that current limit;
   C. sensor means for sensing the quiescent bus current and providing an indication thereof;
   D. variation means for determining whether the bus current has departed from the quiescent bus current by more than a predetermined amount and providing an indication thereof;
   E. control means, responsive to the sensor means and the variation means and connected for application of control signals to the driver means and programming signals to the back-driving source, for operating the driver means to apply disabling signals to all of the bus devices so that all properly operating bus devices are disabled, operating the back-driving source to back-drive the bus to the de-assertion voltage level while all properly operating devices remain disabled, operating the sensor means to measure the quiescent current that results from the back-driving, selecting each bus device in succession, operating the driver means to apply enabling signals to the selected bus device individually while the other bus devices that are operating properly remain disabled, applying programming signals to the back-driving source to cause it to drive the bus with a current limit greater than the quiescent current but less than the sum of the quiescent current and the assertion-current capacity of the selected bus device, and providing an indication that the selected bus device is defective if the variation means indicates that the bus current has departed from the quiescent current by more than the predetermined amount.

2. A test apparatus as defined in claim 1 wherein the variation means and the sensor means comprise the same current sensor.

3. A test apparatus as defined in claim 1 wherein the variation means comprises means in the back-driving source for indicating whether the output current of the back-driving source has reached the current limit.

4. A test apparatus as defined in claim 1 wherein the variation means comprises a digital voltage sensor for determining whether the departure of the bus current from its quiescent level is greater than the predetermined amount by determining whether the bus voltage has departed from the de-assertion level by more than a predetermined voltage minimum.

5. For performing a test on an electronic circuit comprising a common bus and a plurality of bus devices that are operable by application of enabling and disabling signals thereto to assume, when they are operating properly, enabled and disabled states, respectively, such that they drive the bus voltage to an assertion voltage value when at least one of the bus devices is in its asserted state, and such that the bus voltage assumes a de-assertion voltage value when all of the bus devices are in their disabled states, the purpose of the test being to determine which of the bus devices is driving the bus to an assertion voltage level even though all of the bus devices have had disabling signals applied thereto, a method comprising the steps of:
   A. applying disabling signals to all of the bus devices so that all properly operating bus devices are disabled;
   B. back-driving the bus to the de-assertion voltage level while all properly operating devices remain disabled;
   C. measuring the quiescent current that results from the back-driving;
   D. selecting each bus device in succession;
   E. applying enabling signals to the selected bus device individually while the other bus devices that are operating properly remain disabled;
   F. driving the bus with a current to tend to drive it to the de-assertion level but with a current limit greater than the quiescent current but less than the sum of the quiescent current and the assertion-current capacity of the selected bus device;
   G. determining whether the resultant departure of the bus current from its quiescent level is greater than a predetermined current minimum; and
   H. if the resultant departure of hhe bus current from its quiescent level is not greater than a predetermined current minimum, indicating that the selected bus device is defective.

* * * * *